United States Patent
Sakai et al.

(10) Patent No.: US 11,552,647 B2
(45) Date of Patent: Jan. 10, 2023

(54) RAMP SIGNAL OUTPUT CIRCUIT AND PHOTOELECTRIC CONVERSION APPARATUS

(71) Applicant: CANON KABUSHIKI KAISHA, Tokyo (JP)

(72) Inventors: Seiichirou Sakai, Kanagawa (JP); Kazuo Yamazaki, Kanagawa (JP); Hiroaki Kameyama, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/511,252

(22) Filed: Oct. 26, 2021

(65) Prior Publication Data

US 2022/0140838 A1 May 5, 2022

(30) Foreign Application Priority Data

Oct. 29, 2020 (JP) .............................. JP2020-181148

(51) Int. Cl.
| | |
|---|---|
| *H04N 5/3745* | (2011.01) |
| *H03M 1/46* | (2006.01) |
| *H03M 1/18* | (2006.01) |
| *H03M 1/56* | (2006.01) |
| *H04N 5/378* | (2011.01) |

(52) U.S. Cl.
CPC ............. *H03M 1/56* (2013.01); *H03M 1/468* (2013.01); *H04N 5/378* (2013.01); *H04N 5/37455* (2013.01)

(58) Field of Classification Search
None
See application file for complete search history.

(56) References Cited

U.S. PATENT DOCUMENTS 10,637,356 B2 * 4/2020 Mehas ................ H02M 3/1584

FOREIGN PATENT DOCUMENTS

JP 2017175565 A 9/2017

* cited by examiner

*Primary Examiner* — Mark T Monk
(74) *Attorney, Agent, or Firm* — Canon U.S.A., Inc. IP Division

(57) ABSTRACT

A ramp signal output circuit includes a first reference current source transistor to which a current is supplied from a current source, a first line connecting a gate of the first reference current source transistor and a gate of a first current source transistor, a branch point where a second line branches from the first line, a first ramp signal generation unit connected to the first current source transistor, and a second ramp signal generation unit connected to a second current source transistor, wherein the second line is connected to a gate of the second current source transistor.

20 Claims, 15 Drawing Sheets

RAMP SIGNAL OUTPUT CIRCUIT AND PHOTOELECTRIC CONVERSION APPARATUS

BACKGROUND

Technical Field

One disclosed aspect of the embodiments relates to a ramp signal output circuit and a photoelectric conversion apparatus including the ramp signal output circuit.

Description of the Related Art

Japanese Patent Application Laid-Open No. 2017-175565 discusses a ramp signal output circuit that outputs a first ramp signal and a second ramp signal. The potential of the first ramp signal changes at a rate of a first changing quantity per unit time. The potential of the second ramp signal changes at a rate of a second changing quantity per unit time. The second changing quantity per unit time is greater than the first changing quantity per unit time.

In Japanese Patent Application Laid-Open No. 2017-175565, a gate of a transistor that generates the first ramp signal, which has the potential that changes at the rate of the first changing quantity, and a gate of a transistor that generates the second ramp signal, which has the potential that changes at the rate of the second changing quantity greater than the first changing quantity, are connected to each other via a common bias line. In this case, the second ramp signal changes a bias line voltage, and such a change degrades the linearity of the first ramp signal that uses the common bias line.

One disclosed aspect of the embodiments is directed to improving the linearity of a ramp signal in a ramp signal output circuit that generates a plurality of ramp signals.

SUMMARY

According to an aspect of the disclosure, a ramp signal output circuit includes a first reference current source transistor to which a current is supplied from a current source, a first line connecting a gate of the first reference current source transistor and a gate of a first current source transistor, a branch point where a second line branches from the first line, a first ramp signal generation unit connected to the first current source transistor, and a second ramp signal generation unit connected to a second current source transistor, wherein the second line is connected to a gate of the second current source transistor.

According to another aspect of the disclosure, a ramp signal output circuit includes a first reference current source transistor to which a current from a first current source is supplied, a second reference current source transistor to which a current from a second current source is supplied, a first line connecting a gate of the first reference current source transistor and a gate of a first current source transistor, a second line connecting a gate of the second reference current source transistor and a gate of a second current source transistor, a first ramp signal generation unit connected to the first current source transistor, and a second ramp signal generation unit connected to the second current source transistor.

Further features of the present invention will become apparent from the following description of exemplary embodiments with reference to the attached drawings.

DESCRIPTION OF THE EMBODIMENTS

Various exemplary embodiments will be described below with reference to the drawings.

In the following exemplary embodiments, mainly an image capturing apparatus is described as an example of a photoelectric conversion apparatus. However, the exemplary embodiments are not limited to the image capturing apparatuses and are also applicable to examples other than the photoelectric conversion apparatuses. The examples include a distance measurement apparatus (an apparatus for distance measurement using focus detection or time-of-flight (TOF)) and a photometer apparatus (an apparatus for measurement of a quantity of incident light).

Conductivity types of transistors described in the following exemplary embodiments are mere examples and are not intended to limit the conductivity types of the transistors to those described in the exemplary embodiments. Each conductivity type described in the exemplary embodiments can be changed as needed, and in a case where the conductivity type of a transistor is changed, the potentials of a gate, a source, and a drain of the transistor are changed as appropriate.

For example, in a case where the conductivity type of a transistor that operates as a switch is changed, a potential to be supplied to a gate of the transistor is changed to a low level or a high level to reverse the level described in the exemplary embodiment. Further, conductivity types of semiconductor regions described in the following exemplary embodiments are also mere examples and are not intended to limit the conductivity types to those described in the exemplary embodiments. Each conductivity type described in the exemplary embodiments can be changed as needed, and in a case where the conductivity type of a semiconductor region is changed, the potential of the semiconductor region is changed as appropriate.

A photoelectric conversion apparatus and a method of driving the photoelectric conversion apparatus according to a first exemplary embodiment of the present invention will be described below with reference to FIGS. 1 to 6.

(Overall Configuration of Photoelectric Conversion Apparatus)

Figure 1:
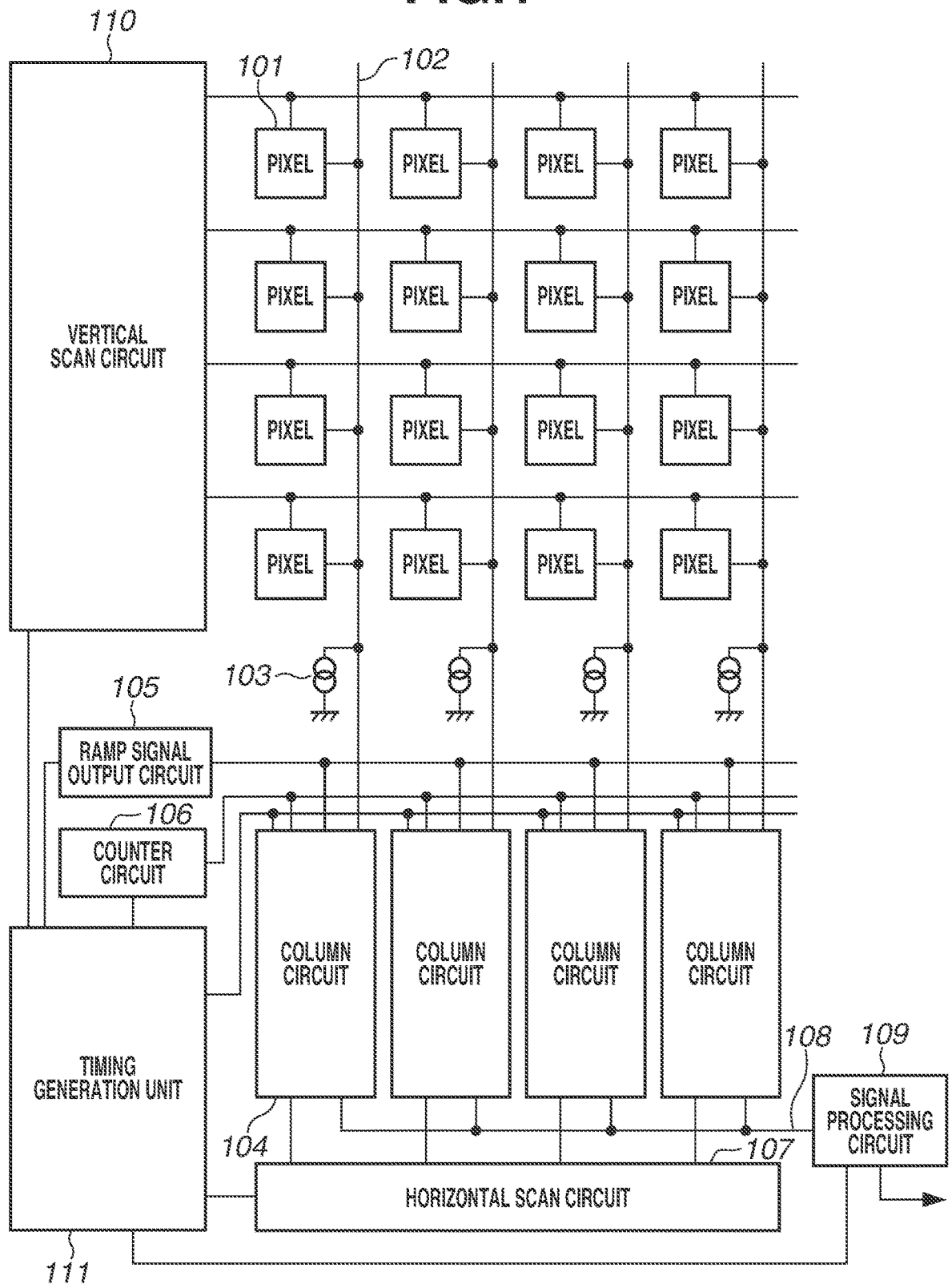
FIG. 1 is a schematic diagram illustrating a photoelectric conversion apparatus including a ramp signal output circuit according to a first exemplary embodiment.

As illustrated in FIG. 1, the photoelectric conversion apparatus according to the present exemplary embodiment includes pixels 101, vertical output lines 102, pixel current sources 103, column circuits 104, a ramp signal output circuit 105, and a counter circuit 106. The photoelectric conversion apparatus according to the present exemplary embodiment further includes a horizontal scan circuit 107, a horizontal output line 108, a signal processing circuit 109, a vertical scan circuit 110, and a timing generation unit 111.

The plurality of pixels 101 is arranged in a matrix with a plurality of rows and a plurality of columns in a pixel region of the photoelectric conversion apparatus. While sixteen pixels 101 arranged in a matrix with four rows and four columns are illustrated in FIG. 1, the number of pixels 101 included in the pixel region is not limited to a specific number. For example, the pixels 101 can be arranged in a matrix with several thousand rows and several thousand columns in the pixel region as in a general digital camera, or the plurality of pixels 101 included in the pixel region can be arranged in a single row or column.

Each of the pixels 101 includes a photoelectric conversion element that generates a charge by photoelectric conversion. The pixels 101 convert the charges generated by the photoelectric conversion elements into voltage signals and output the generated voltage signals to the vertical output lines 102.

The pixel current sources 103 are electrically connected to the vertical output lines 102 and supply a current to the vertical output lines 102. Each of the pixel current sources 103 is not limited to a configuration in which a predetermined amount of current is passed, and the amount of current can be changed.

The column circuits 104 are provided correspondingly to the columns of the pixels 101 of the pixel region and are connected to the respective pixels 101 arranged in the column direction to form common signal lines for the pixels 101. Output signals from the pixels 101 (pixel output signals) are input to the column circuits 104 via the vertical output lines 102. The column circuits 104 amplify the pixel output signals and perform analog-to-digital conversion (AD conversion).

The ramp signal output circuit 105 generates a ramp signal for use in the AD conversion by the column circuits 104. The ramp signal is a signal with a potential that changes time-dependently at a constant variation ratio. The ramp signal output circuit 105 can output a plurality of ramp signals having a different gradient from each other. Details thereof will be described below.

The counter circuit 106 outputs a count signal CNT for use in the AD conversion by the column circuits 104. The count signal CNT is a signal that counts a clock pulse signal CLK supplied from a clock pulse supply unit (not illustrated) from when the ramp signal of the ramp signal output circuit 105 starts changing time-dependently.

The signals that are AD converted by the column circuits 104 are sequentially output column by column to the outside of the image capturing apparatus via the horizontal output line 108 and the signal processing circuit 109 by the horizontal scan circuit 107. The signal processing circuit 109 can include a memory for holding pixel signals read from the pixels 101.

The vertical scan circuit 110 selects the pixels 101 row by row and drives the pixels 101 of the selected row.

The timing generation unit 111 supplies a driving signal to the vertical scan circuit 110, the horizontal scan circuit 107, the column circuits 104, the ramp signal output circuit 105, and the counter circuit 106.

(Pixel Configuration)

A configuration of each of the pixels 101 according to the present exemplary embodiment will be described below.

Figure 2:
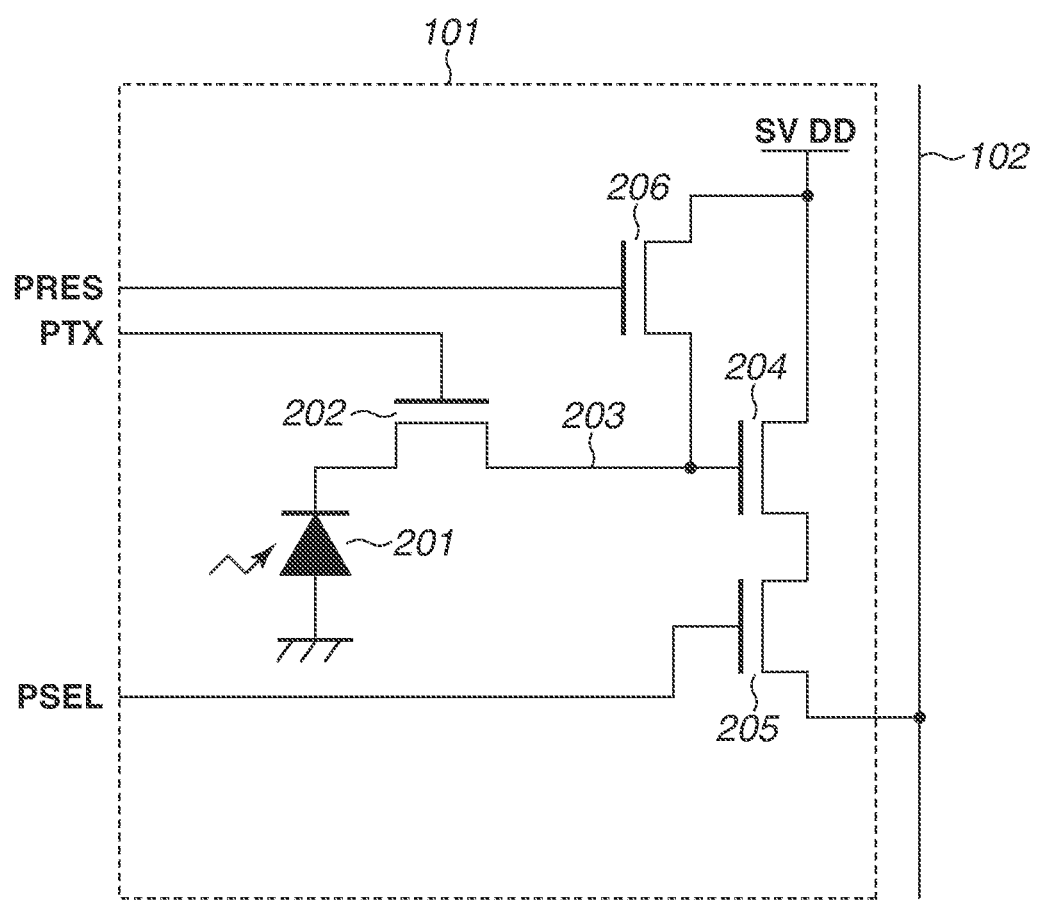
FIG. 2 illustrates an example of a pixel circuit configuration of the photoelectric conversion apparatus including the ramp signal output circuit according to the first exemplary embodiment.

FIG. 2 illustrates an example of a configuration of an equivalent circuit of a pixel according to the first exemplary embodiment. Each of the pixels 101 includes a photoelectric conversion unit 201. The pixel 101 further includes a transfer metal oxide semiconductor transistor (transfer MOS transistor) 202, a floating diffusion unit (hereinafter, FD) 203, an amplification metal oxide semiconductor transistor (amplification MOS transistor) 204, a selection metal oxide semiconductor transistor (selection MOS transistor) 205, and a reset metal oxide semiconductor transistor (reset MOS transistor) 206.

A function of each element and an electrical connection relationship between the elements will be described below.

In the pixel 101, the photoelectric conversion unit 201 converts incident light into a charge and accumulates the charge as a signal charge. A photodiode will be described herein as an example of the photoelectric conversion unit 201.

The transfer MOS transistor 202 transfers the charge accumulated in the photoelectric conversion unit 201 to the FD 203.

When the selection MOS transistor 205 is changed to an on-state, the amplification MOS transistor 204 amplifies a signal based on the charge transferred to the FD 203 and outputs the amplified signal to a corresponding vertical output line 102.

The reset MOS transistor 206 resets the potentials of the FD 203 and the photoelectric conversion unit 201.

Gates of the transfer MOS transistor 202, the reset MOS transistor 206, and the selection MOS transistor 205 are connected to the vertical scan circuit 110 and controlled by control signals PTX, PRES, and PSEL, respectively.

(Column Circuit Configuration)

Figure 3:
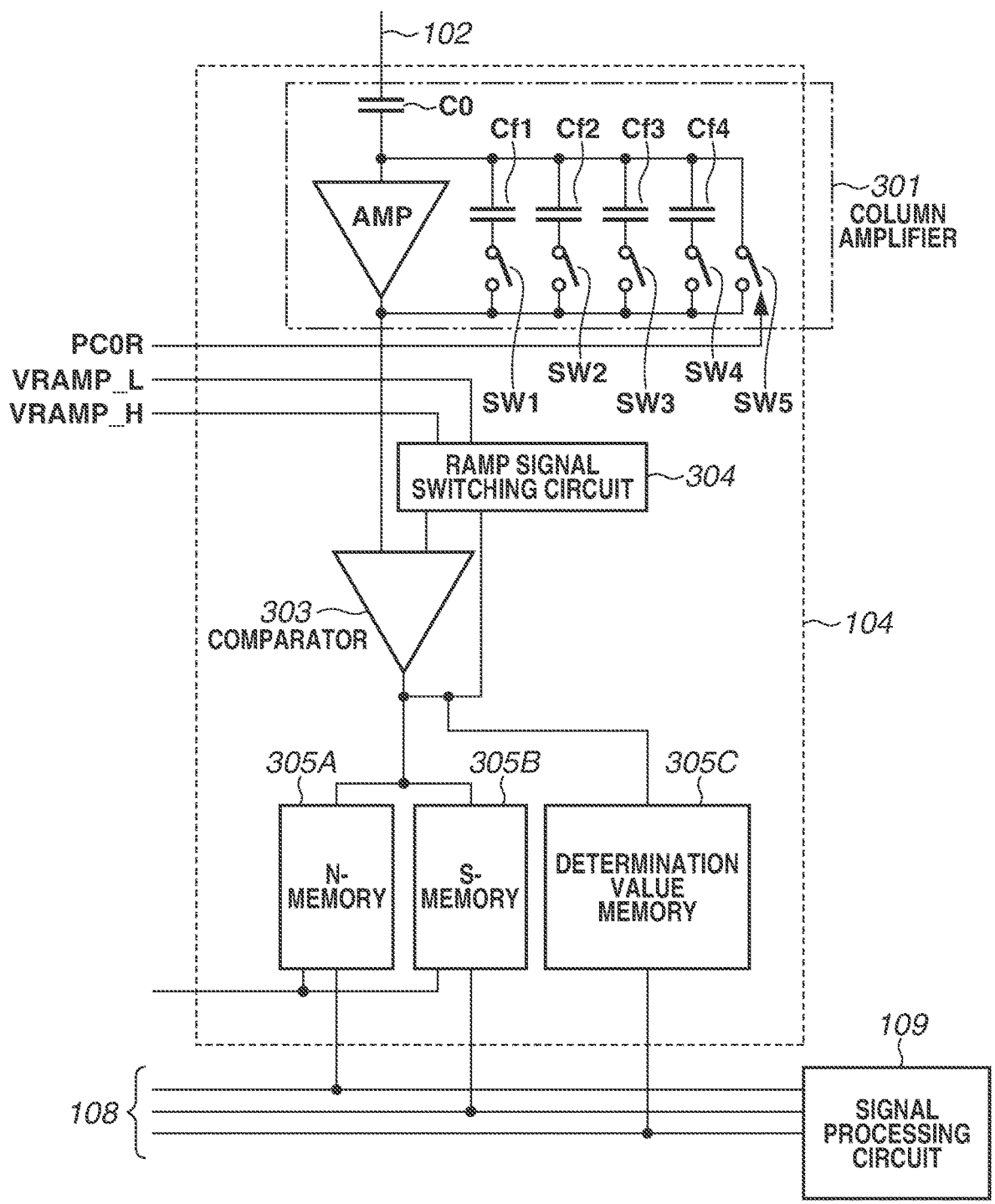
FIG. 3 illustrates an example of a column circuit configuration of the photoelectric conversion apparatus including the ramp signal output circuit according to the first exemplary embodiment.

FIG. 3 illustrates an example of a circuit configuration of the column circuits 104 according to the present exemplary embodiment.

Each of the column circuits 104 includes a column amplifier 301, a comparator 303, a ramp signal switching circuit 304, and a memory 305.

A function of each element and an electrical connection relationship between the elements will be described below.

A pixel signal PIXOUT output from the pixel 101 is input to the column amplifier 301 via the vertical output line 102.

The column amplifier 301 amplifies the pixel signal PIXOUT and outputs the amplified signal to the comparator 303. The column amplifier 301 includes an amplifier AMP, an input capacitor C0, feedback capacitors Cf1, Cf2, Cf3, and Cf4, and switches SW1, SW2, SW3, SW4, and SW5. A gain of the column amplifier 301 is determined by a ratio between a capacitance value of the feedback capacitors Cf that are active on a feedback path of the amplifier AMP and a capacitance value of the input capacitor C0. Thus, the gain of the column amplifier 301 can be changed by switching the switches SW1 to SW4 between an on-state and an off-state.

A ramp signal VRAMP supplied from the ramp signal output circuit 105 illustrated in FIG. 1 is input to an input terminal of the comparator 303 based on a selection result by the ramp signal switching circuit 304. Details of the operation of the ramp signal switching circuit 304 will be described below. An output signal AMPOUT of the column amplifier 301 is input to another input terminal of the comparator 303. The comparator 303 compares the column amplifier output signal AMPOUT input from the column amplifier 301 and the ramp signal VRAMP supplied from the ramp signal output circuit 105 and outputs one of two values of a low level and a high level based on a magnitude relationship between the compared signals. Specifically, in a case where the ramp signal VRAMP is lower in voltage than the output signal AMPOUT, the low level is output, whereas in a case where the ramp signal VRAMP is higher in voltage than the output signal AMPOUT, the high level is output.

The counter circuit 106 outputs the count signal CNT of a count of the clock pulse signal CLK supplied from the clock pulse supply unit (not illustrated) from when the ramp signal VRAMP of the ramp signal output circuit 105 starts changing time-dependently. Specifically, the counter circuit 106 counts the clock pulse signal CLK in parallel with the change in potential of the ramp signal VRAMP, generates the count signal CNT, and outputs the generated count signal CNT. The count signal CNT is supplied to an N-memory 305A and an S-memory 305B of each column.

The N-memory 305A and the S-memory 305B hold the count signal CNT supplied from the counter circuit 106 when the signal value of an output COMPOUT supplied from the comparator 303 changes from the low level to the high level. The N-memory 305A holds a digital signal obtained by AD converting a reset-level signal (hereinafter, referred to as an N-signal) of the FD 203. The S-memory 305B holds a digital signal obtained by AD converting a signal (hereinafter, referred to as an S-signal) obtained by superimposing a signal from the photoelectric conversion unit 201 on the N-signal of the FD 203.

A determination value memory 305C holds a result (hereinafter, referred to as a J-signal) of comparison between a reference signal VREF, which is generated based on the ramp signal VRAMP, and the output of the column amplifier 301 by the comparator 303. The J-signal is also input to the ramp signal switching circuit 304.

The signals held by the N-memory 305A, the S-memory 305B, and the determination value memory 305C are output to the signal processing circuit 109 via the horizontal output line 108 based on a control signal from the horizontal scan circuit 107. Then, the signal processing circuit 109 subtracts the N-signal from the S-signal and outputs a noise-removed signal. Details of processing of the signal processing circuit 109 will be described below.

(Pixel Signal Reading Operation)

Figure 4:
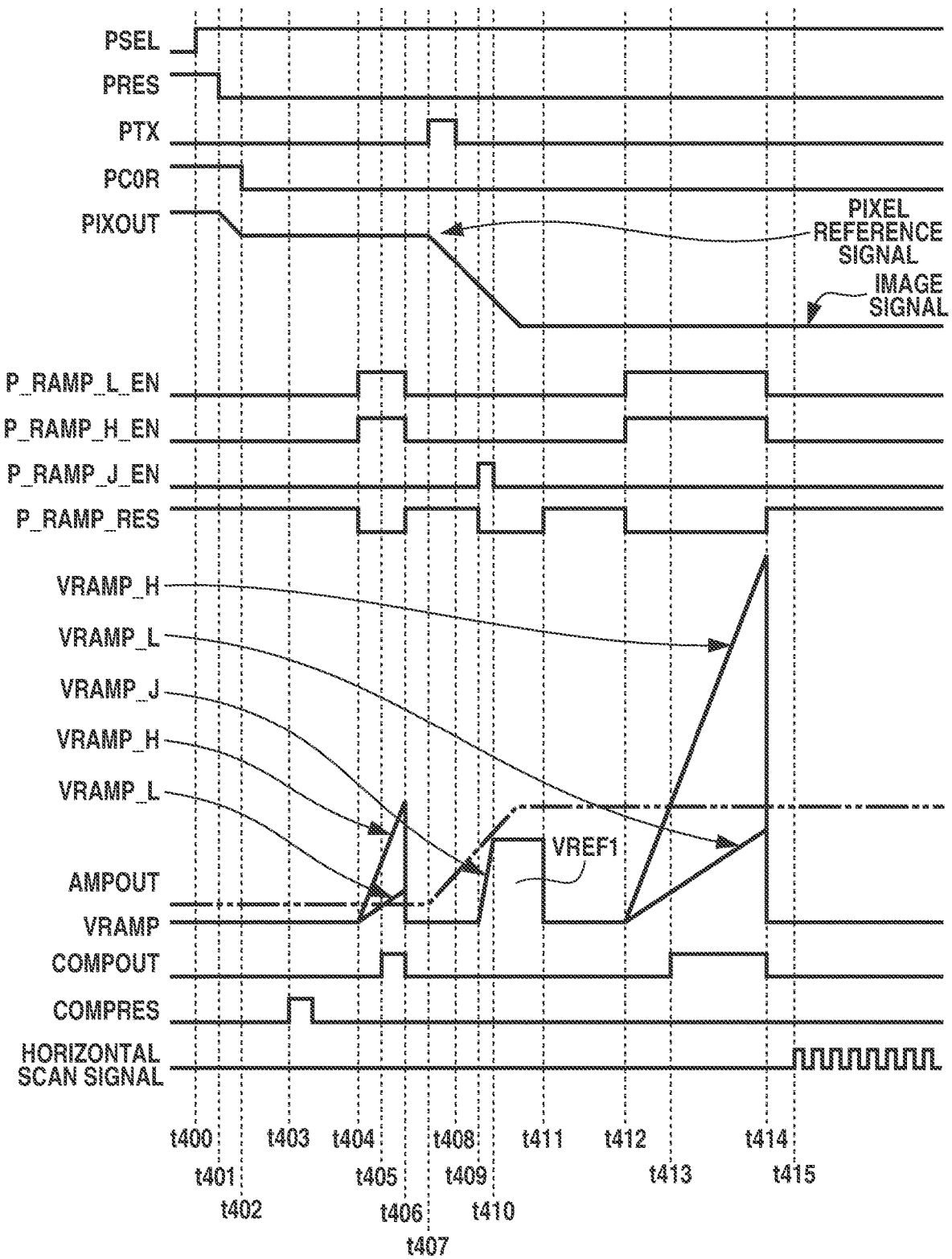
FIG. 4 is a timing chart illustrating a pixel signal reading operation of the photoelectric conversion apparatus including the ramp signal output circuit according to the first exemplary embodiment.

FIG. 4 illustrates an example of a timing chart of a pixel signal reading operation of the photoelectric conversion apparatus according to the present exemplary embodiment. FIG. 4 schematically illustrates timings of driving pulses, a pixel output voltage, a column amplifier output voltage, and ramp signals.

At time t400, a selection pulse PSEL is changed to a high (H) level, and a row of the pixels 101 from which the pixel signal PIXOUT is to be output is selected. At this time, the reset pulse PRES is at an H level, and the potential of the FD 203 is reset.

At time t401, the reset pulse PRES is changed to a low (L) level. The pixel signal PIXOUT that is output at rest will be referred to as a pixel reference signal. The pixel reference signal is a signal containing a noise component of the pixels 101.

At time t402, an input capacitor C0 reset pulse PCOR is changed from an H level to a L level, and the resetting of the amplifier AMP and the input capacitor C0 is cancelled. Consequently, the input capacitor C0 holds a charge based on the potential of the pixel reference signal at the time when the input capacitor C0 reset pulse PCOR is at the L level, and the column amplifier 301 outputs the column amplifier output signal AMPOUT.

At time t403, a comparator reset pulse COMPRES is changed to an H level and thereafter to an L level. The comparator reset pulse COMPRES is for resetting and initialization the comparator 303 and is output from the timing generation unit 111.

From time t404 to time t406, the ramp signal output circuit 105 increases the potentials of a ramp signals VRAMP_L and VRAMP_H time-dependently from initial values. Details of the operation of the ramp signal output circuit 105 will be described below. The ramp signal output circuit 105 can output a plurality of ramp signals each having a different gradient and input the plurality of ramp signals to the column circuits 104. A ramp signal VRAMP_L has a low gradient, a ramp signal VRAMP_H has a high gradient, and a ramp signal VRAMP_J has a higher gradient. Herein, only the ramp signal VRAMP_L is input to the comparator 303 via the ramp signal switching circuit 304. The ramp signal VRAMP_L with a lower potential changing quantity per unit time than that of the ramp signal VRAMP_H is used as a reference voltage so that the AD conversion is performed with high resolution. The foregoing driving is implemented by transmitting a control signal from the timing generation unit 111 to the ramp signal output circuit 105 and the ramp signal switching circuit 304.

While the potential of the ramp signal VRAMP_L starts changing at time t404, the counter circuit 106 starts counting the clock pulse signal CLK and supplies the count signal CNT to the N-memory 305A of each column.

At time t405, the voltage of the ramp signal VRAMP_L exceeds the column amplifier output signal AMPOUT, and the signal value of the output COMPOUT of the comparator 303 changes. The signal value of the count signal CNT at this time is stored in the N-memory 305A. The signal value of the count signal CNT that is stored in the N-memory 305A is a value obtained by AD converting the N-signal.

At time t406, the time-dependent potential change of the ramp signals VRAMP_L and VRAMP_H is stopped, and the ramp signals VRAMP_L and VRAMP_H are reset to the states at time t400. The counter circuit 106 stops counting the clock pulse signal CLK and restores the count signal CNT to an initial value.

At time t407, the transfer pulse PTX is changed to an H level, and at time t408, the transfer pulse PTX is changed to an L level. In this way, a signal charge generated by the photoelectric conversion unit 201 photoelectrically converting incident light is transferred to the FD 203. The amplification MOS transistor 204 outputs a signal based on the potential of the FD 203. The output signal of the amplification MOS transistor 204 is output to the vertical output lines 102 via the selection MOS transistor 205. The pixel signal PIXOUT at this time will be referred to as an image signal.

The column amplifier 301 outputs the column amplifier output signal AMPOUT generated by inverting the potential of a difference between the pixel reference signal and the pixel signal PIXOUT and amplifying the inverted potential. The column amplifier output signal AMPOUT is input to an input terminal of the comparator 303.

During a period from time t409 to time t411, the ramp signal VRAMP_J is input to another input terminal of the comparator 303. The ramp signal VRAMP_J is generated by the ramp signal output circuit 105 and is input to the comparator 303 via the ramp signal switching circuit 304.

From time t409 to time t410, the ramp signal output circuit 105 increases the potential of the ramp signal VRAMP_J time-dependently from an initial value.

At time t410, the potential change of the ramp signal VRAMP_J is stopped. The voltage of the ramp signal VRAMP_J at time t410 serves as a reference voltage VREF1.

During a period from time t410 to time t411, the comparator 303 compares the reference voltage VREF1 and the column amplifier output signal AMPOUT. In a case where the voltage of the column amplifier output signal AMPOUT is lower than the reference voltage VREF1, the output COMPOUT of the comparator 303 is at the H level (=1). The output COMPOUT is also input to the ramp signal switching circuit 304, and the ramp signal switching circuit 304 selects the ramp signal VRAMP_L and inputs the ramp signal VRAMP_L to the input terminal of the comparator 303.

In a case where the voltage of the column amplifier output signal AMPOUT is higher than the reference voltage VREF1, the output COMPOUT of the comparator 303 is at the L level (=0). The ramp signal switching circuit 304 selects the ramp signal VRAMP_H and inputs the ramp signal VRAMP_H to the input terminal of the comparator 303.

During the period from time t410 to time t411, the output value of the comparator 303 is determined as a determination value J, and the determination value J is input to the ramp signal switching circuit 304 and stored in the determination value memory 305C.

At time t411, the determination on which one of the ramp signals VRAMP_H and VRAMP_L is to be used during an S-signal AD conversion period is ended, and the potential of the ramp signal VRAMP_J is reset.

From time t412 to time t414, the ramp signal output circuit 105 increases the ramp signals VRAMP_L and VRAMP_H time-dependently from the initial values. Which one of the ramp signals VRAMP_L and VRAMP_H is to be input to the comparator 303 from each of the column circuits 104 is determined based on the value of the output COMPOUT during the period from time t410 to time t411.

In the case illustrated in FIG. 4, since the column amplifier output signal AMPOUT during the period from time t410 to time t411 is higher than the reference voltage VREF1, the ramp signal VRAMP_H having a relatively high gradient is selected.

When the potential of the ramp signal VRAMP_H starts changing at time t412, the counter circuit 106 starts counting the clock pulse signal CLK and supplies the count signal CNT to the S-memory 305B of each column.

At time t413, the voltage of the ramp signal VRAMP_H exceeds the column amplifier output signal AMPOUT, and the signal value of the output COMPOUT of the comparator 303 changes. The signal value of the count signal CNT at this time is stored in the S-memory 305B. The signal value of the count signal CNT that is stored in the S-memory 305B at this time is a value obtained by AD converting the S-signal.

At time t414, the time-dependent potential change of the ramp signals VRAMP_L and VRAMP_H is stopped, and the ramp signals VRAMP_L and VRAMP_H are reset to the states at time t400. The counter circuit 106 stops counting the clock pulse signal CLK and restores the count signal CNT to the initial value.

From time t415, the column circuits 104 are sequentially operated by the horizontal scan circuit 107. Consequently, the signals stored in the N-memory 305A, the S-memory 305B, and the determination value memory 305C are transmitted to the signal processing circuit 109 via the horizontal output line 108. Then, after calculation processing is performed, the signals are output to the outside of the photoelectric conversion apparatus.

The signal processing circuit 109 calculates a differential signal level (light component) by subtracting the N-signal from the S-signal. Before the subtraction of the N-signal from the S-signal, AD conversion result correction processing is performed using the ramp signal selected when the S-signal is AD converted.

The AD conversion result correction processing will be described below. For example, in a case where the gradient of the ramp signal VRAMP_H is four times the gradient of the ramp signal VRAMP_L, a signal amplitude of the ramp signal VRAMP_H that corresponds to one count of the count signal CNT is four times wider than that of the ramp signal VRAMP_L. Thus, in order to adjust the digital output to the signal potential level, the count value that is AD converted using the ramp signal VRAMP_H is increased fourfold using a digital gain. In a case where the determination value J=0, the ramp signal VRAMP_H is selected, so that the S-signal input to the signal processing circuit 109 is increased fourfold, whereas in a case where the determination value J=1, the ramp signal VRAMP_L is selected, so that the processing of increasing fourfold is not performed.

Figure 5:
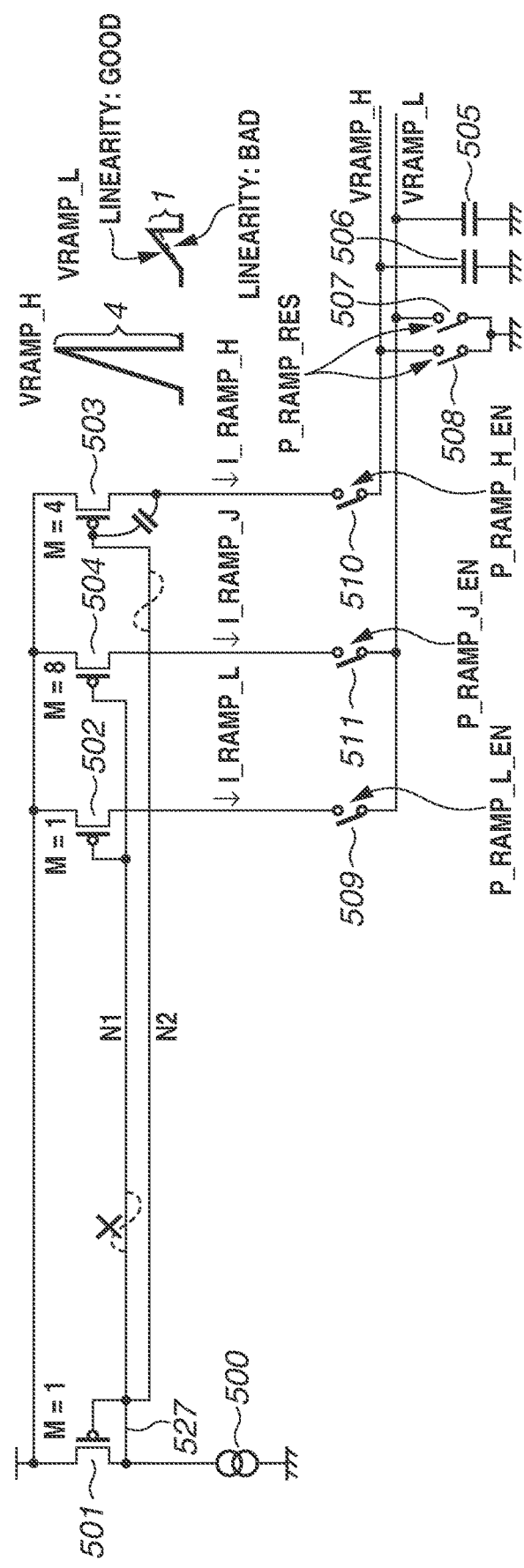
FIG. 5 illustrates an example of a ramp signal output circuit configuration of the photoelectric conversion apparatus including the ramp signal output circuit according to the first exemplary embodiment.

While the level of the reference voltage VREF1 for obtaining the determination value J can be set as desired, in the case where, for example, the gradient of the ramp signal VRAMP_H is four times the gradient of the ramp signal VRAMP_L, it is desirable to set the level of the reference voltage VREF1 to one fourth of the amplitude of the output signal to be AD converted. More specifically, in a case where the amplitude of the output signal to be AD converted is 1 [V], the reference voltage VREF1 is set to correspond to an amplitude of 0.25 [V]. In a case where the counter in AD conversion is 12 bits and is set to count up to 4095, the ramp signal VRAMP_L is controlled to have an amplitude of 0.25 [V] at 4095 counts. Further, the ramp signal VRAMP_H is controlled to have an amplitude of 1 [V] at 4095 counts. A result after the correction processing in a case where the AD conversion is performed with the foregoing configuration is as follows. For low luminance outputs with a low amplitude of 0.25 [V] or less, an output result of 0 to 4095 in one-count increments is obtained. For high luminance outputs with a large amplitude higher than 0.25 [V] and not higher than 1 [V], an output result of 4096 to 16380 in four-count increments is obtained. Thus, a resolution of the high luminance output is coarser than a resolution of the low luminance output, but AD conversion is performed at high speed up to a count corresponding to 14 bits. FIG. 5 is a circuit diagram illustrating an example of a circuit configuration of the ramp signal output circuit 105. A function of each element of the circuit and an electrical connection relationship between the elements will be described below.

In FIG. 5, the ramp signal output circuit 105 includes a current source 500 and current mirror p-channel metal oxide semiconductor transistors (current mirror PMOS transistors) (hereinafter, also referred to as PMOS transistors) 501, 502, 503, and 504. The ramp signal output circuit 105 further includes integral capacitors 505 and 506, n-channel metal oxide semiconductor transistors for resetting (NMOS transistors for resetting) 507 and 508, and ramp current supply switches 509, 510, and 511.

The ramp current supply switch 509 is changed to an on-state when a control pulse P_RAMP_L_EN is changed to an H level. Similarly, the ramp current supply switch 510 is controlled by a control pulse P_RAMP_H_EN, and the ramp current supply switch 511 is controlled by a control pulse P_RAMP_J_EN. When a control pulse P_RAMP_RES is changed to an H level, the NMOS transistors for resetting 507 and 508 are both changed to an on-state and reset the potentials of the ramp signals VRAMP_L and VRAMP_H, respectively.

The PMOS transistor 501 is a reference current source transistor to which a reference current is supplied from the current source 500. The PMOS transistors 502, 503, and 504 are each a current source transistor that outputs a current proportional to a transistor size ratio of the PMOS transistors 502, 503, and 504 to the PMOS transistor 501.

In the present exemplary embodiment, the size ratio of the PMOS transistors 501, 502, 503, and 504 is, for example, 1:1:4:8. The PMOS transistor 502 outputs a current I_RAMP_L. The PMOS transistor 503 outputs a current I_RAMP_H. The PMOS transistor 504 outputs a current I_RAMP_J. When the ramp current supply switches 509, 510, and 511 are changed to an on-state, the currents I_RAMP_L, I_RAMP_H, and I_RAMP_J respectively output from the PMOS transistors 502, 503, and 504 charge the integral capacitors 505 and 506, and a ramp signal with a potential that changes time-dependently is generated. In other words, the integral capacitors 505 and 506 are a ramp signal generation unit according to the present exemplary embodiment.

The PMOS transistor 502 generates the ramp signal VRAMP_L. The PMOS transistor 503 generates the ramp signal VRAMP_H. The PMOS transistor 504 generates the ramp signal VRAMP_J. The integral capacitors 505 and 506 have the same capacitance. Since the ratio of the currents I_RAMP_L, I_RAMP_H, and I_RAMP_J is 1:4:8, the potential changing quantity per unit time of the ramp signal VRAMP_H is four times the ramp signal VRAMP_L, and the potential changing quantity per unit time of the ramp signal VRAMP_J is eight times the ramp signal VRAMP_L.

The ramp signals VRAMP_L and VRAMP_H are generated at the same time during a period from time t404 to time 406 and a period from time t412 to time t414 in the timing chart in FIG. 4. During the period from time t404 to time 406, the control pulse P_RAMP_RES is at an L level and control pulses P_RAMP_L_EN and P_RAMP_H_EN are at an H level so that the ramp signals VRAMP_L and VRAMP_H are generated. At this time, the N-signal is AD converted using the ramp signal VRAMP_L. At time t406, the control pulse P_RAMP_RES is changed to the H level, and the control pulses P_RAMP_L_EN and P_RAMP_H_EN are changed to the L level so that the time-dependent potential change of the ramp signal VRAMP_L stops. During the period from time t412 to time t414, the S-signal is AD converted using one of the ramp signals VRAMP_L and VRAMP_H based on a result of the determination during the period from time t410 to time t411. Specifically, the control pulses P_RAMP_L_EN and P_RAMP_H_EN are changed to the H level so that the potentials of the ramp signals VRAMP_L and VRAMP_H increase. At time t414, the control pulse P_RAMP_RES is changed to the H level and the control pulses P_RAMP_L_EN and P_RAMP_H_EN are changed to the L level so that the time-dependent potential change of the ramp signals VRAMP_L and VRAMP_H stops.

The ramp signal VRAMP_H with a great potential changing quantity per unit time changes the potential of a bias line N2 connected to a gate of the PMOS transistor 503 via a gate-drain capacitor of the PMOS transistor 503. When this change is transmitted to a bias line N1, the potential of the bias line N1 changes, and the current I_RAMP_L that the PMOS transistor 502 outputs changes. This degrades the linearity of the ramp signal VRAMP_L for use in AD conversion of a low luminance signal, which requires accuracy, and an image quality is degraded. In the present exemplary embodiment, the bias lines N1 and N2 are separated near the reference current transistor. In other words, there is a branch portion (branch point) 527 where the bias lines N1 and N2 branch between the reference current source PMOS transistor 501 and the current source PMOS transistor 502. Thus, the bias line N2 is connected to the PMOS transistor 503 without the PMOS transistor 502. With the foregoing configuration, even in a case where the potential of the bias line N2 is changed, the change is reduced by a parasitic resistance and a parasitic capacitance and is moderated by the current source 500 so that a change in potential of the bias line N1 is reduced. Thus, a change in the current I_RAMP_L output from the PMOS transistor 502 is reduced compared to a conventional technique, and the linearity of the ramp signal VRAMP_L is improved.

In the foregoing operations, the ramp signal switching circuit 304 selects one of the ramp signals VRAMP_L and VRAMP_H based on the result of the determination by the comparator 303 and inputs the selected ramp signal VRAMP_L or VRAMP_H to the comparator 303. Alternatively, another configuration according to the present exemplary embodiment can include two comparators for one column amplifier, and a ramp signal is input to one of the comparators and another ramp signal is input to the other comparator as illustrated in FIG. 6.

Figure 6:
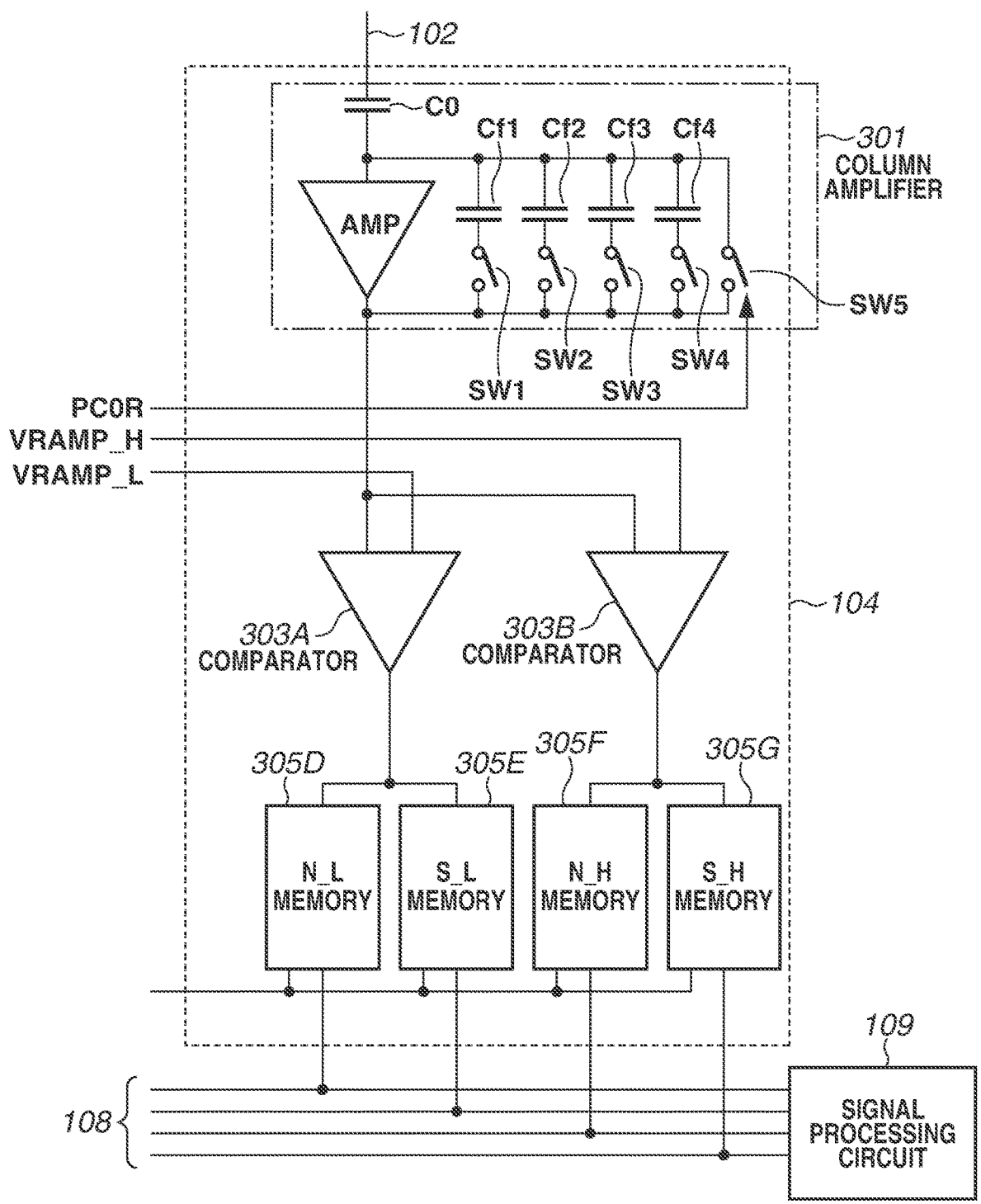
FIG. 6 illustrates an example of a column circuit configuration of the photoelectric conversion apparatus including the ramp signal output circuit according to the first exemplary embodiment.

In FIG. 6, the ramp signal VRAMP_L is input to one input terminal of a comparator 303A, and a column amplifier output is input to another input terminal of the comparator 303A. The comparator 303A compares the ramp signal VRAMP_L and the column amplifier output, and writes the digital value of the N-signal to an N_L memory 305D and the digital value of the S-signal to an S_L memory 305E as in the above-described AD conversion operation. The ramp signal VRAMP_H is input to one input terminal of a comparator 303B, and the column amplifier output is input to another input terminal of the comparator 303B. The comparator 303B compares the ramp signal VRAMP_H and the column amplifier output, and writes the digital value of the N-signal to an N_H memory 305F and the digital value of the S-signal to an S_H memory 305G as in the above-described AD conversion operation.

The signals stored in the N_L memory 305D, the S_L memory 305E, the N_H memory 305F, and the S_H memory 305G are output to the signal processing circuit 109 via the horizontal output line 108 based on a control signal from the horizontal scan circuit 107. The signal processing circuit 109 subtracts an N_L signal from an S_L signal and generates a difference S_L signal. Similarly, the signal processing circuit 109 subtracts an N_H signal from an S_H signal and generates a difference S_H signal. The difference S_L signal and the difference S_H signal after noise removal are combined together to obtain a low-noise image. Since each column includes two comparators and two memories, the circuit size increases, but a level determination operation becomes unnecessary, and thus a speed of the AD conversion is increased.

The potential changing quantities per unit time of the ramp signals VRAMP_L, VRAMP_H, and VRAMP_J described above are different from one another. However, in the present exemplary embodiment, a change in bias line voltage can be reduced and the ramp signal linearity can be improved even in a case where, for example, the PMOS transistors 501, 502, 503, and 504 have the same size and the potential changing quantities per unit time of the ramp signals are set to be the same. For example, the line of the ramp signal VRAMP_L according to the present exemplary embodiment is connected to the comparator 303 of one or some of the plurality of column circuits 104. The line of the ramp signal VRAMP_H according to the present exemplary embodiment is connected to the comparator 303 of another one or ones of the column circuits 104. The gradients of the ramp signals VRAMP_L and VRAMP_H at this time are the same as described above. With this form of connection, the driving load (driving loads of the PMOS transistors 502, 503, and 504) of the ramp signal output circuit 105 is reduced. Further, the line of the ramp signal VRAMP_L can be connected to one of the comparators 303 of an adjacent column circuit 104 and the line of the ramp signal VRAMP_H to the other of the comparators 303. With this form of connection, transmission of noise (e.g., through current noise generated when the output COMPOUT is inverted) generated from one of the comparators 303 to the other comparator 303 is reduced.

Figure 7:
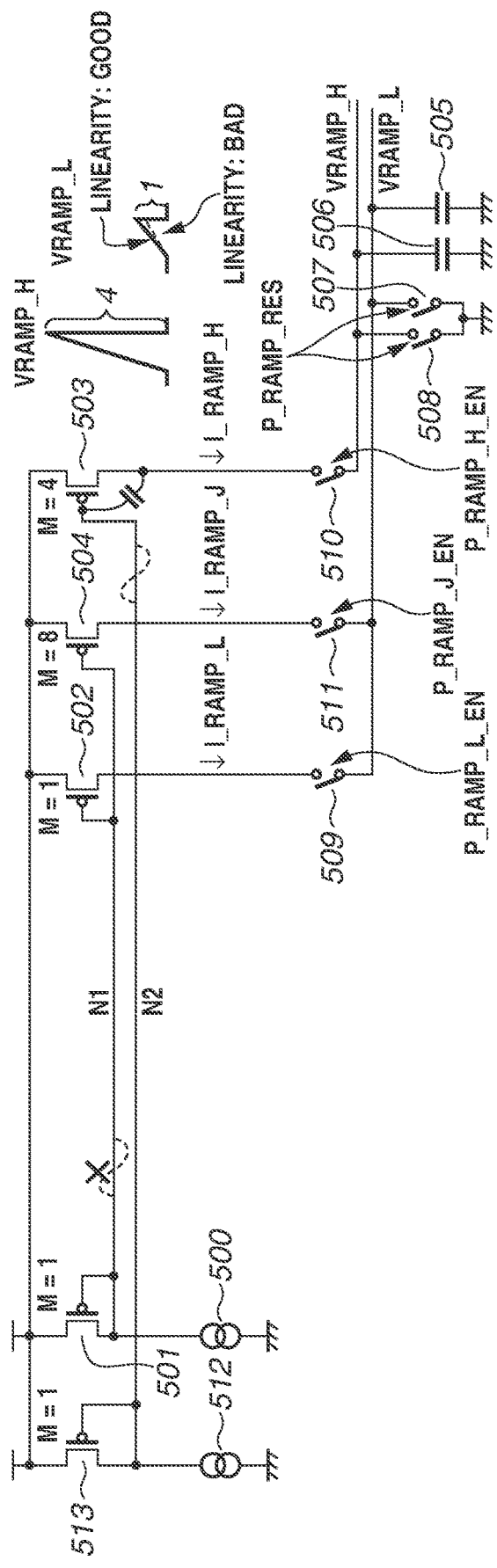
FIG. 7 illustrates an example of a ramp signal output circuit configuration of a photoelectric conversion apparatus including a ramp signal output circuit according to a second exemplary embodiment.

FIG. 7 illustrates a ramp signal output circuit according to a second exemplary embodiment of the present invention.

In FIG. 7, a component similar to the corresponding component of the ramp signal output circuit in FIG. 5 is given the same reference numeral, and a detailed description thereof is omitted. A difference between the circuit illustrated in FIG. 7 and the circuit illustrated in FIG. 5 will be described below. The ramp signal output circuit illustrated in FIG. 7 includes a current source 512 and a current mirror PMOS transistor 513.

A reference current is supplied from the current source 512 to the PMOS transistor 513, and the gate of the PMOS transistor 503 and a gate of the PMOS transistor 513 are connected via the bias line N2. The PMOS transistor 513 is configured as a current mirror circuit different from the PMOS transistor 501.

In the present exemplary embodiment, the bias lines N1 and line N2 are configured using different current mirror circuits, and there is not a common impedance. Thus, even in a case where the potential of the bias line N2 is changed by the ramp signal VRAMP_H, the potential of the bias line N1 does not change, and a change in the current I_RAMP_L that the PMOS transistor 502 outputs can be prevented. In other words, the linearity of the ramp signal VRAMP_L can be improved.

Figure 8:
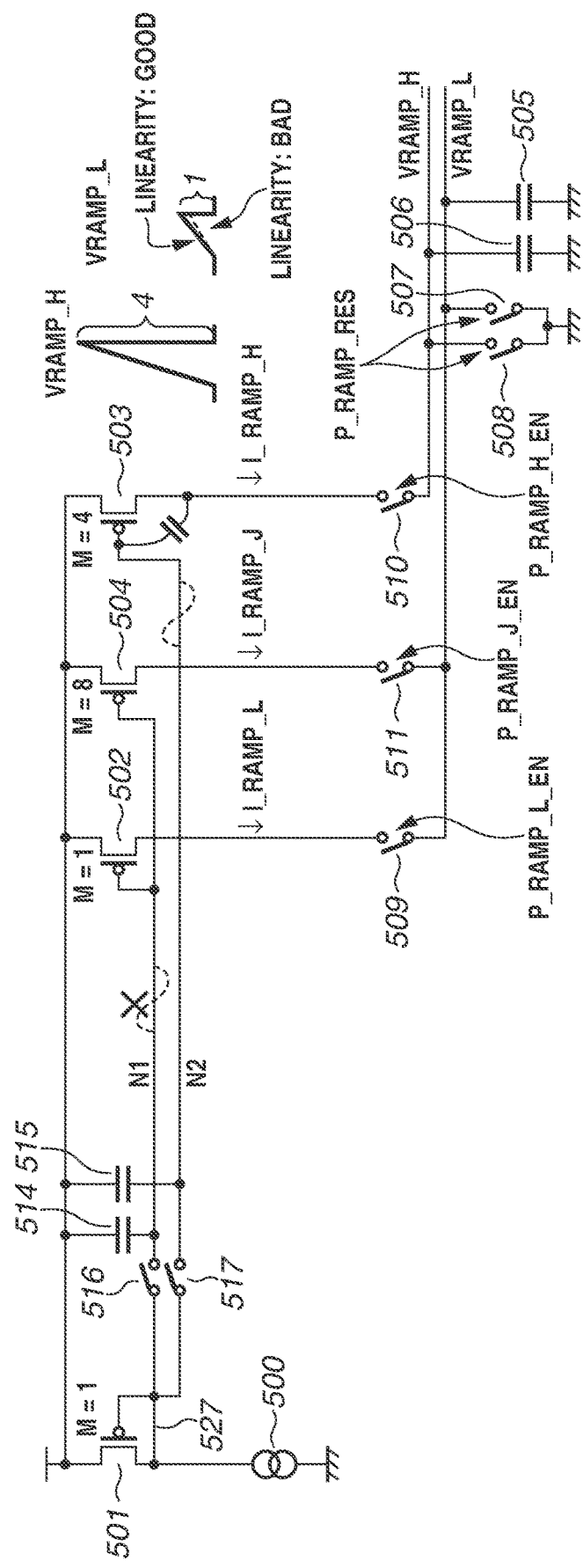
FIG. 8 illustrates an example of a ramp signal output circuit configuration of a photoelectric conversion apparatus including a ramp signal output circuit according to a third exemplary embodiment.

FIG. 8 illustrates a ramp signal output circuit according to a third exemplary embodiment of the present invention.

In FIG. 8, a component similar to the corresponding component of the ramp signal output circuit in FIG. 5 is given the same reference numeral, and a detailed description thereof is omitted. A difference between the circuit illustrated in FIG. 8 and the circuit illustrated in FIG. 5 will be described below.

The ramp signal output circuit illustrated in FIG. 8 includes sampling and holding capacitors 514 and 515 and sampling and holding switches 516 and 517.

A difference from the ramp signal output circuit illustrated in FIG. 5 is that the bias line N1 includes the sampling and holding switch 516 and the sampling and holding capacitor 514 and the bias line N2 includes the sampling and holding switch 517 and the sampling and holding capacitor 515. The bias lines N1 and N2 respectively change the sampling and holding switches 516 and 517 to an off-state and hold a bias voltage in the sampling and holding capacitors 514 and 515 so that noise generated in the current source 500 and the PMOS transistor 501 does not affect the ramp signals. Thus, noise is reduced.

The bias line potential holding can be performed in an operation of reading each line or each frame.

Further, in the present exemplary embodiment, the bias lines N1 and N2 are separated by the sampling and holding switches 516 and 517, and even in a case where the potential of the bias line N2 is changed by the ramp signal VRAMP_H, the potential of the bias line N1 does not change. Thus, a change in the current I_RAMP_L that the PMOS transistor 502 outputs can be prevented, and the linearity of the ramp signal VRAMP_L can be improved.

Figure 9:
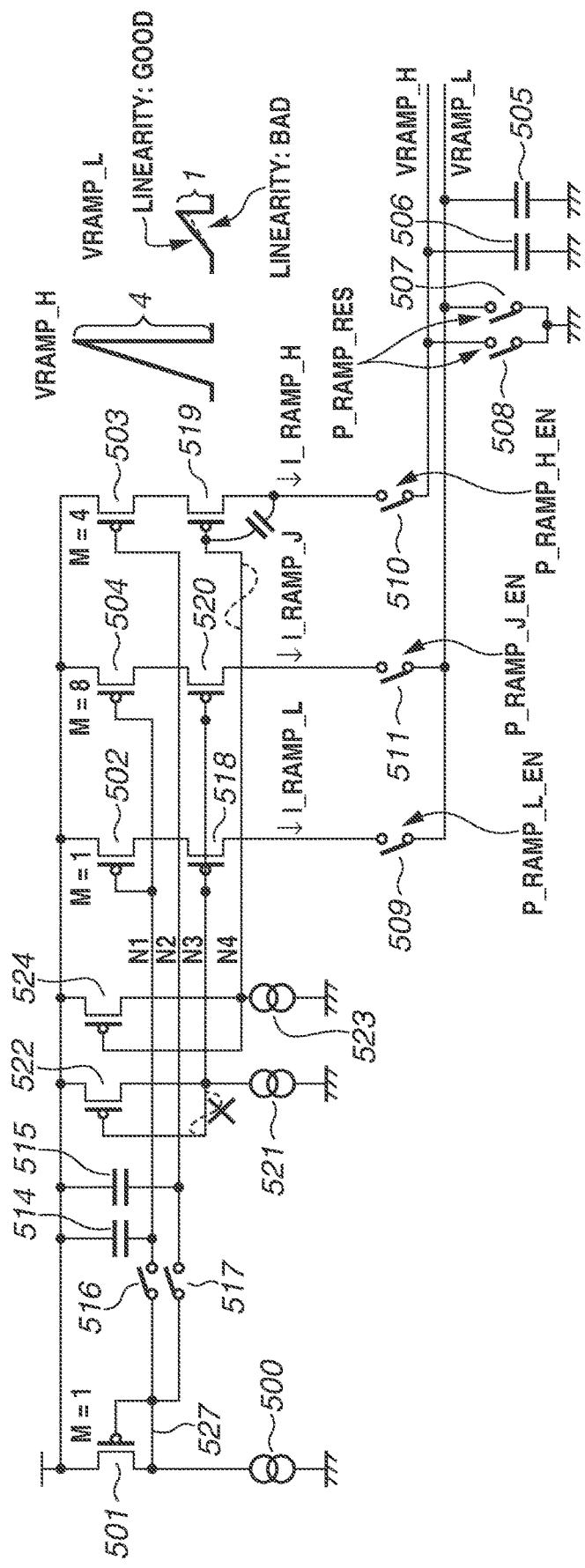
FIG. 9 illustrates an example of a ramp signal output circuit configuration of a photoelectric conversion apparatus including a ramp signal output circuit according to a fourth exemplary embodiment.

FIG. 9 illustrates a ramp signal output circuit according to a fourth exemplary embodiment of the present invention.

In FIG. 9, a component similar to the corresponding component of the ramp signal output circuit in FIG. 8 is given the same reference numeral, and a detailed description thereof is omitted. A difference between the circuit illustrated in FIG. 9 and the circuit illustrated in FIG. 8 will be described below.

The ramp signal output circuit illustrated in FIG. 9 includes PMOS transistors 518, 519, 520, 522, and 524 and reference current sources 521 and 523.

A difference from the ramp signal output circuit illustrated in FIG. 8 is that the grounded-gate PMOS transistors (grounded-gate transistors) 518, 519, and 520 are situated on the output sides of the PMOS transistors 502, 503, and 504. Gates of the PMOS transistors 518 and 520 are connected to a common grounded-gate line N3, and the potential of the grounded-gate line N3 is determined by the reference current source 521 and the PMOS transistor 522. Similarly, the potential of a grounded-gate line N4 of the PMOS transistor 519 is determined by the reference current source 523 and the PMOS transistor 524. The grounded-gate potential is set so that the PMOS transistors 502, 503, and 504 operate in a saturation region. This produces an effect that the voltages of the ramp signals VRAMP_L, VRAMP_H, and VRAMP_J are prevented from directly changing the drain voltages of the PMOS transistors 502, 503, and 504.

In the present exemplary embodiment, the grounded-gate PMOS transistor 519 is placed to prevent a change in the potential of the bias line N2 by the ramp signal VRAMP_H. Instead, the ramp signal VRAMP_H with a great potential changing quantity per unit time changes the potential of the grounded-gate line N4 connected to a gate of the PMOS transistor 519 via a gate-drain capacitor of the PMOS transistor 519. When the change is transmitted to the grounded-gate line N3, the potential of the grounded-gate line N3 changes, and the drain voltage of the PMOS transistor 502 changes. Even when the PMOS transistor 502 operates in the saturation region, if the drain voltage changes, a certain amount of change in current occurs due to an effect of channel length modulation. If the current I_RAMP_L that the PMOS transistor 502 outputs changes, the linearity of the ramp signal VRAMP_L for use in AD conversion of a low luminance signal, which requires accuracy, is degraded, and the image quality is degraded.

In the present exemplary embodiment, the grounded-gate lines N3 and N4 are independent lines so that even when the potential of the grounded-gate line N4 changes, the potential of the grounded-gate line N3 does not change. Thus, the drain voltage of the PMOS transistor 502 is maintained constant, so that the current I_RAMP_L does not change, and the linearity of the ramp signal VRAMP_L is improved.

Figure 10:
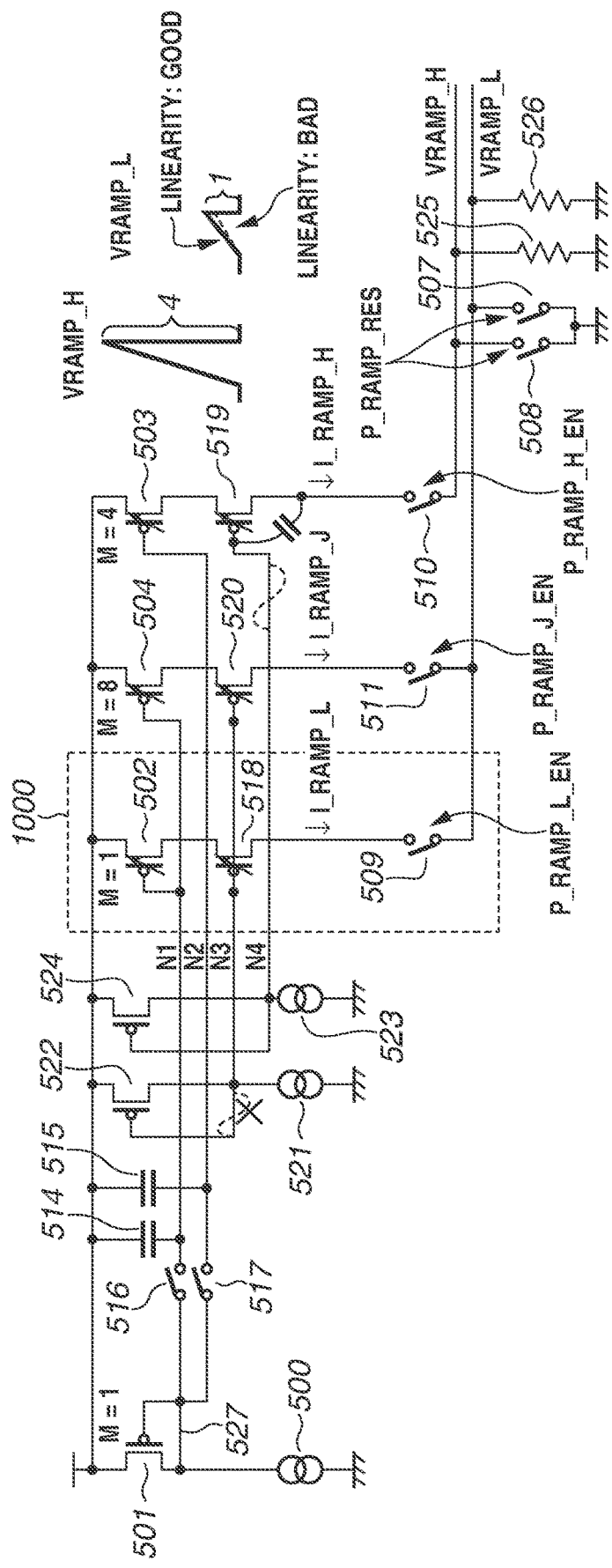
FIG. 10 illustrates an example of a ramp signal output circuit configuration of a photoelectric conversion apparatus including a ramp signal output circuit according to a fifth exemplary embodiment.

FIG. 10 illustrates a ramp signal output circuit according to a fifth exemplary embodiment of the present invention.

In FIG. 10, a component similar to the corresponding component of the ramp signal output circuit in FIG. 9 is given the same reference numeral, and a detailed descriptions thereof is omitted. A difference between the circuit illustrated in FIG. 10 and the circuit illustrated in FIG. 9 will be described below.

The ramp signal output circuit illustrated in FIG. 10 includes termination resistors 525 and 526.

The ramp signal output circuit according to the present exemplary embodiment includes the termination resistors 525 and 526 instead of the integral capacitors 505 and 506, and the size of each PMOS transistor indicated with a diagonal arrow is variable so that a ramp signal is output. The PMOS transistors 502 and 518 and the switch 509, which are surrounded by a broken line, constitute a generation portion 1000 of the ramp signal VRAMP_L.

Figure 11:
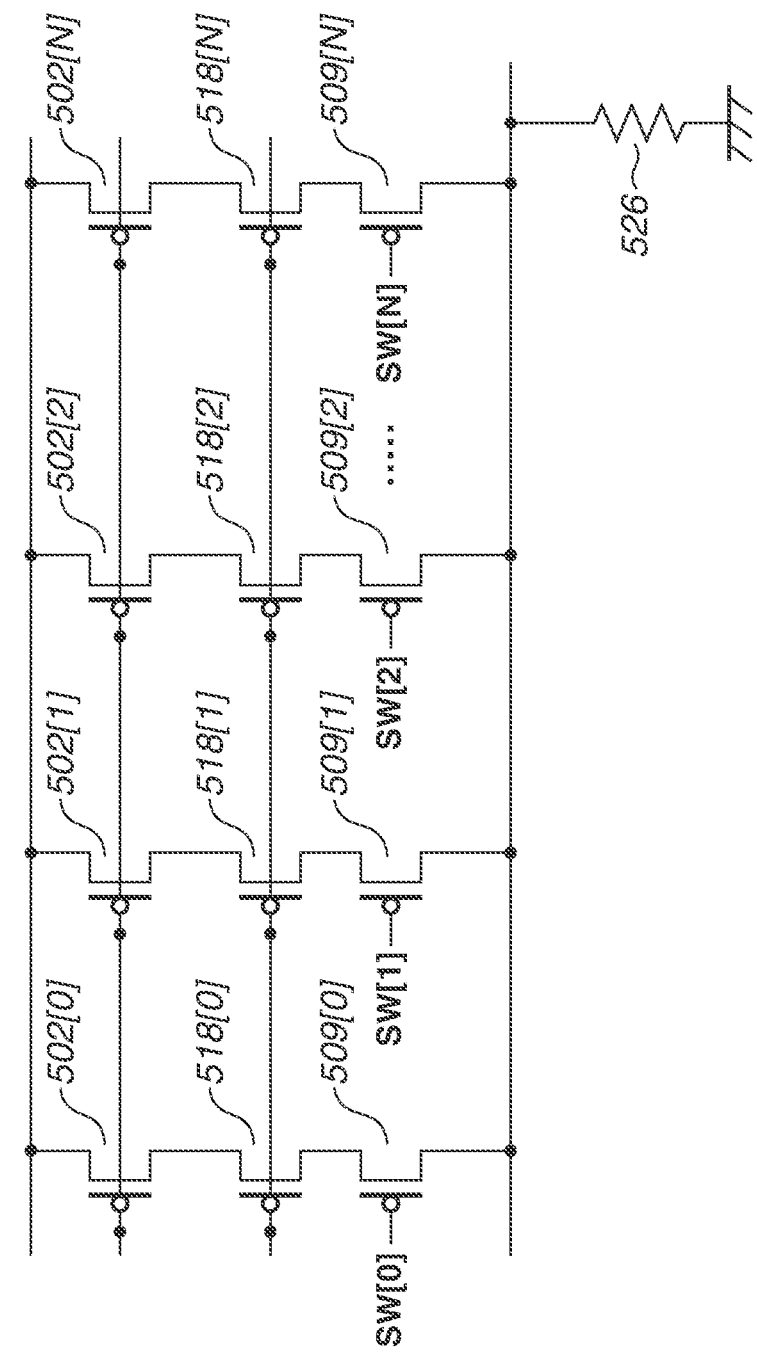
FIG. 11 illustrates an example of a configuration of a VRAMP_L signal generation portion of the photoelectric conversion apparatus including the ramp signal output circuit according to the fifth exemplary embodiment.

FIG. 11 illustrates details of the generation portion 1000 of the ramp signal VRAMP_L.

The ramp signal output circuit according to the present exemplary embodiment controls a current using N+1 switches 509. A signal that is input to a gate of the switch 509 is a signal SW[N]. The value of the ramp signal VRAMP_L is based on a product of the total current output from N+1 PMOS transistors 502 and a resistance value R of the termination resistor 526.

Figure 12:
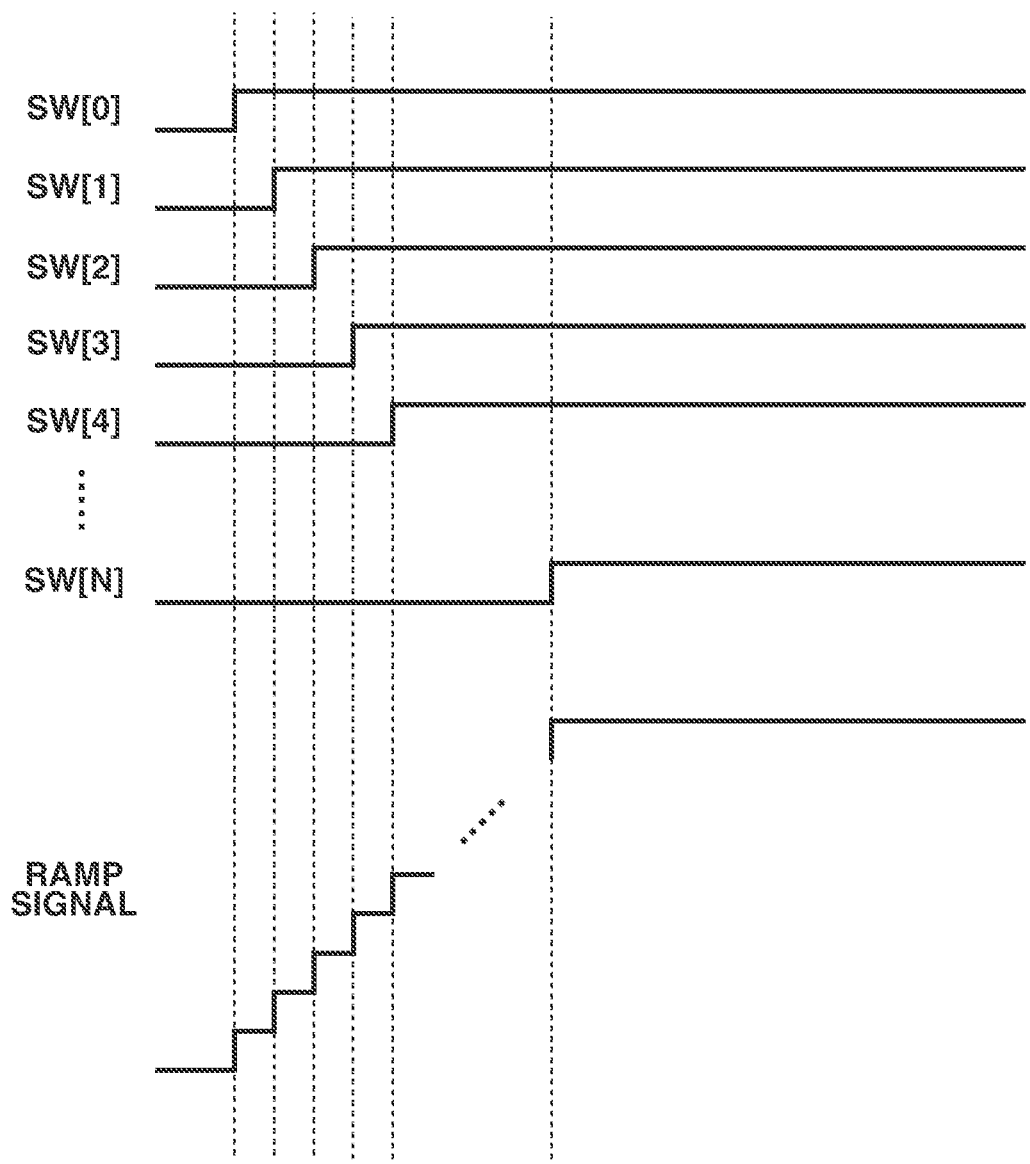
FIG. 12 is an operation timing chart of the ramp signal output circuit of the photoelectric conversion apparatus including the ramp signal output circuit according to the fifth exemplary embodiment.

FIG. 12 illustrates driving timings of the signals SW[N] and the ramp signal. The zeroth to Nth switches 509 are controlled to sequentially change to an on-state at predetermined intervals to generate a ramp signal that changes in potential with a predetermined gradient.

While a ramp signal generation method is different, the present exemplary embodiment also produces an effect that the grounded-gate PMOS transistor 519 is placed to prevent the potential of the bias line N2 from being changed by the ramp signal VRAMP_H, as in the fourth exemplary embodiment. Instead, the ramp signal VRAMP_H with a great potential changing quantity per unit time changes the potential of the grounded-gate line N4 connected to the gate of the PMOS transistor 519 via a gate-drain capacitor of the PMOS transistor 519. When the change is transmitted to the grounded-gate line N3, the potential of the grounded-gate line N3 changes, and the drain voltage of the PMOS transistor 502 changes. Even when the PMOS transistor 502 operates in the saturation region, if the drain voltage changes, a certain amount of change in current occurs due to an effect of channel length modulation. If the current I_RAMP_L that the PMOS transistor 502 outputs changes, the linearity of the ramp signal VRAMP_L for use in AD conversion of a low luminance signal, which requires accuracy, is degraded, and the image quality is degraded.

In the present exemplary embodiment, the grounded-gate lines N3 and N4 are independent lines so that even when the potential of the grounded-gate line N4 changes, the potential of the grounded-gate line N3 does not change. Thus, the drain voltage of the PMOS transistor 502 is maintained constant, so that the current I_RAMP_L does not change, and the linearity of the ramp signal VRAMP_L is improved.

The first to fifth exemplary embodiments are described above with reference to the schematic diagram illustrating the photoelectric conversion apparatus in FIG. 1 and the like.

Figure 13:
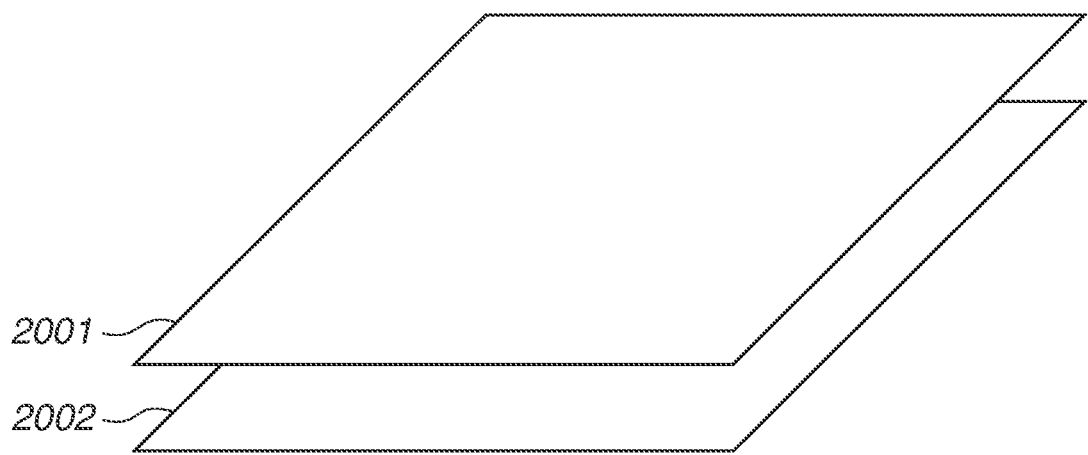
FIG. 13 is a schematic diagram illustrating a photoelectric conversion apparatus having a layered structure.

Each circuit according to the exemplary embodiments of the present invention can be formed on a single semiconductor substrate, or can be arranged on two or more semiconductor substrates as illustrated in FIG. 13, and the substrates can be bonded together to form a layered structure. While FIG. 13 illustrates the layered structure consisting of two substrates that are a first semiconductor substrate 2001 and a second semiconductor substrate 2002, a layered structure consisting of three or more substrates can be formed by, for example, dividing the circuit or adding a circuit or a function.

Figure 14:
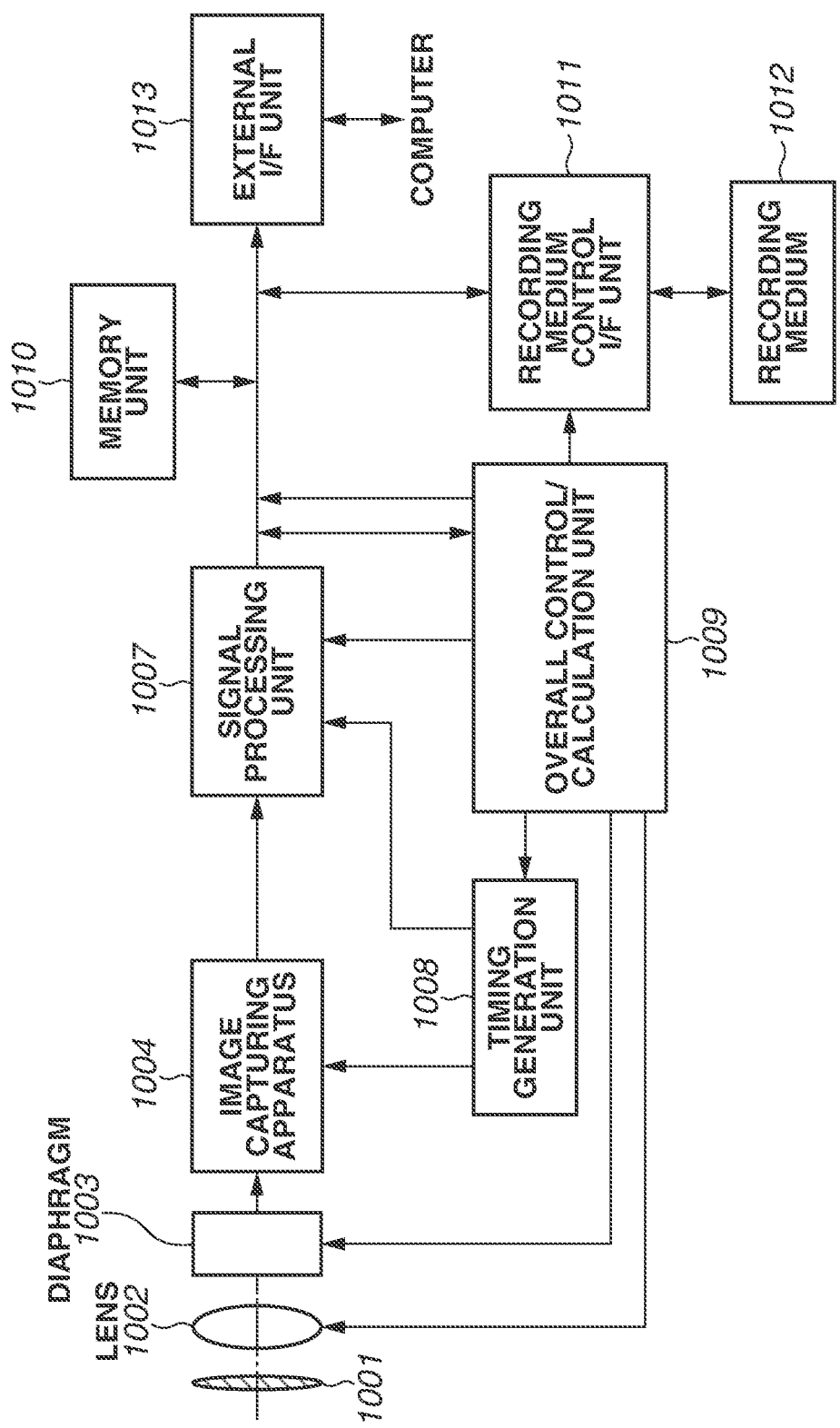
FIG. 14 is a diagram illustrating a configuration of a photoelectric conversion system according to a sixth exemplary embodiment.

A photoelectric conversion system according to a sixth exemplary embodiment will be described below with reference to FIG. 14. FIG. 14 is a block diagram illustrating a schematic configuration of the photoelectric conversion system according to the present exemplary embodiment.

The above-described photoelectric conversion apparatuses (image capturing apparatuses) according to the first to fifth exemplary embodiments are applicable to various photoelectric conversion systems. Examples of applicable photoelectric conversion systems include a digital still camera, a digital camcorder, a monitoring camera, a copying machine, a facsimile machine, a cellular phone, an on-vehicle camera, and an observation satellite. Further, a camera module including an optical system such as a lens and an image capturing apparatus is also an example of the photoelectric conversion system. FIG. 14 is a block diagram illustrating a digital still camera as an example.

The photoelectric conversion system illustrated in FIG. 14 includes an image capturing apparatus 1004, which is an example of the photoelectric conversion apparatus, and a lens 1002. The lens 1002 forms an optical image of a subject on the image capturing apparatus 1004. The photoelectric conversion system further includes a diaphragm 1003 and a barrier 1001. The diaphragm 1003 varies the quantity of light that passes through the lens 1002. The barrier 1001 protects the lens 1002. The lens 1002 and the diaphragm 1003 constitute an optical system that focuses light on the image capturing apparatus 1004. The image capturing apparatus 1004 is one of the photoelectric conversion apparatuses (image capturing apparatuses) according to the above-described exemplary embodiments and converts the optical image formed by the lens 1002 into an electric signal.

The photoelectric conversion system further includes a signal processing unit 1007. The signal processing unit 1007 is an image generation unit that generates an image by processing an output signal output from the image capturing apparatus 1004. The signal processing unit 1007 performs various types of correction and compression as needed and outputs resulting image data. The signal processing unit 1007 can be formed on a semiconductor substrate on which the image capturing apparatus 1004 is provided, or the signal processing unit 1007 can be formed on a semiconductor substrate different from the semiconductor substrate on which the image capturing apparatus 1004 is provided.

The photoelectric conversion system further includes a memory unit 1010 and an external interface unit (external I/F unit) 1013. The memory unit 1010 temporarily stores image data, and the external I/F unit 1013 is an external I/F unit for communication with an external computer. The photoelectric conversion system further includes a recording medium 1012 and a recording medium control interface unit (recording medium control I/F unit) 1011. The recording medium 1012 is a semiconductor memory for recording or reading captured data. The recording medium control I/F unit 1011 is for recording on or reading from the recording medium 1012. The recording medium 1012 can be built in the photoelectric conversion system or can be removable.

The photoelectric conversion system further includes an overall control/calculation unit 1009 and a timing generation unit 1008. The overall control/calculation unit 1009 performs various types of calculation and controls the entire digital still camera. The timing generation unit 1008 outputs various timing signals to the image capturing apparatus 1004 and the signal processing unit 1007. The timing signals can be externally input, and the photoelectric conversion system is to include at least the image capturing apparatus 1004 and the signal processing unit 1007 for processing an output signal that is output from the image capturing apparatus 1004.

The image capturing apparatus 1004 outputs an image capture signal to the signal processing unit 1007. The signal processing unit 1007 performs predetermined signal processing on the image capture signal output from the image capturing apparatus 1004 and outputs resulting image data. The photoelectric conversion system generates an image using the image data.

As described above, in the present exemplary embodiment, the photoelectric conversion system to which any one of the photoelectric conversion apparatuses (image capturing apparatuses) according to the above-described exemplary embodiments is applied can be implemented.

Figure 15A:
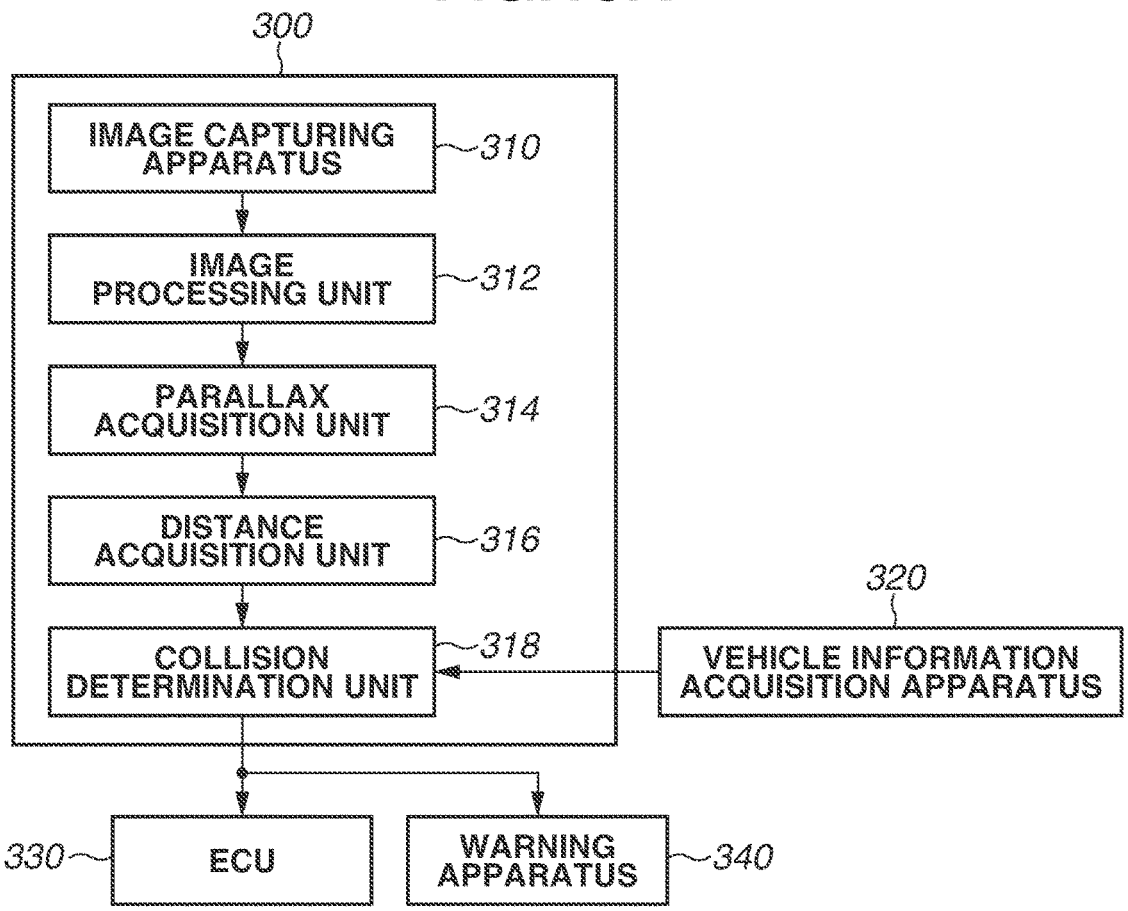
FIGS. 15A and 15B are diagrams illustrating a configuration and an operation of a moving object according to a seventh exemplary embodiment.
Figure 15B:
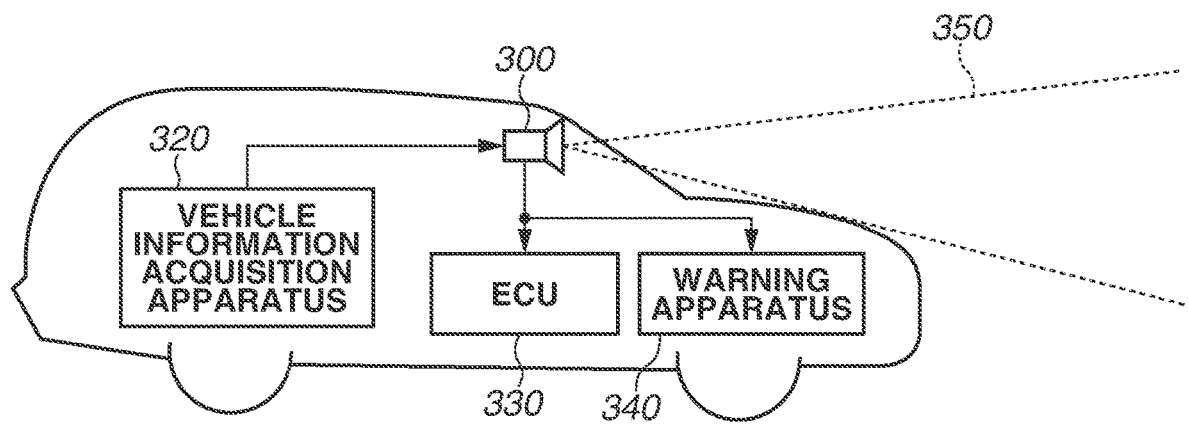

A photoelectric conversion system and a moving object according to a seventh exemplary embodiment will be described below with reference to FIGS. 15A and 15B. FIGS. 15A and 15B are diagrams illustrating configurations of the photoelectric conversion system and the moving object according to the present exemplary embodiment.

FIG. 15A illustrate an example of a photoelectric conversion system that relates to an on-vehicle camera. A photoelectric conversion system 300 includes an image capturing apparatus 310. The image capturing apparatus 310 is one of the photoelectric conversion apparatuses (image capturing apparatuses) according to the above-described exemplary embodiments. The photoelectric conversion system 300 includes an image processing unit 312 and a parallax acquisition unit 314. The image processing unit 312 performs image processing on a plurality of image data acquired by the image capturing apparatus 310. The parallax acquisition unit 314 calculates a parallax (a phase difference of a parallax image) from the plurality of image data acquired by the photoelectric conversion system 300. The photoelectric conversion system 300 further includes a distance acquisition unit 316 and a collision determination unit 318. The distance acquisition unit 316 calculates the distance to a target object based on the calculated parallax. The collision determination unit 318 determines whether there is a possibility of a collision based on the calculated distance. The parallax acquisition unit 314 and the distance acquisition unit 316 are an example of a distance information acquisition unit that acquires distance information about the distance to the target object. Specifically, the distance information include pieces of information about a parallax, a defocus amount, and the distance to the target object. The collision determination unit 318 can determine the possibility of a collision using any of the pieces of distance information. The distance information acquisition unit can be implemented by dedicated hardware or by a software module. Further, the distance information acquisition unit can be implemented by a field programmable gate array (FPGA), an application-specific integrated circuit (ASIC), or a combination thereof.

The photoelectric conversion system 300 is connected to a vehicle information acquisition apparatus 320 and acquires vehicle information such as vehicle velocity, yaw rate, and steering angle. Further, an electronic control unit (ECU) 330 is connected to the photoelectric conversion system 300. The ECU 330 is a control apparatus configured to output a control signal to generate braking force against a vehicle based on a result of determination by the collision determination unit 318. Further, the photoelectric conversion system 300 is also connected to a warning apparatus 340. The warning apparatus 340 gives a warning to a driver based on a result of the determination by the collision determination unit 318. For example, in a case where the collision determination unit 318 determines that the possibility of a collision is high, the ECU 330 controls the vehicle to avoid a collision or reduce damage by applying a brake, releasing an accelerator, or reducing engine output. The warning apparatus 340 warns the user by producing a warning sound, displaying warning information on a screen of a car navigation system, or vibrating a seat belt or a steering.

In the present exemplary embodiment, the photoelectric conversion system 300 captures images of an area around the vehicle, e.g., the front or back of the vehicle. FIG. 15B illustrates the photoelectric conversion system that captures images of the front of the vehicle (image capturing range 350). The vehicle information acquisition apparatus 320 transmits an instruction to the photoelectric conversion system 300 or the image capturing apparatus 310. With the foregoing configuration, accuracy of distance measurement can be further improved.

While an example of the control to avoid a collision with another vehicle is described above, the photoelectric conversion system is also applicable to the control of autonomous driving to follow another vehicle or the control of autonomous driving to avoid a lane departure. Application of the photoelectric conversion system is not limited to a vehicle such as an automobile, and the photoelectric conversion system is also applicable to a moving object (moving apparatus) such as a ship, an aircraft, or an industrial robot. Furthermore, application of the photoelectric conversion system is not limited to a moving object, and the photoelectric conversion system is also applicable to a device that broadly uses object recognition such as an intelligent transport system (ITS).

Modified Examples

The present invention is not limited to the above-described exemplary embodiments, and various modifications are possible.

For example, an example of adding a portion of a configuration according to one of the exemplary embodiments to another exemplary embodiment and an example of replacing a portion of a configuration according to one of the exemplary embodiments with a portion of a configuration according to another exemplary embodiment are included in the exemplary embodiments of the present invention.

Further, the photoelectric conversion system according to the sixth exemplary embodiment illustrated in FIG. 14 and the photoelectric conversion system according to the seventh exemplary embodiment illustrated in FIGS. 15A and 15B are examples of the photoelectric conversion system to which the photoelectric conversion apparatus is applicable. The photoelectric conversion system to which the photoelectric conversion apparatus according to an aspect of the present invention is applicable is not limited to those illustrated in FIGS. 14, 15A, and 15B.

The above-described exemplary embodiments illustrate mere examples of specific implementation of the present invention, and the technical scope of the present invention should not be interpreted narrowly based on the above-described exemplary embodiments. In other words, the present invention is implementable in various forms without departing from the technical concept or major feature of the present invention.

The present invention can improve the linearity of a ramp signal in a ramp signal output circuit that generates a plurality of ramp signals.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-181148, filed Oct. 29, 2020, which is hereby incorporated by reference herein in its entirety.

What is claimed is:
1. A ramp signal output circuit comprising:
a first reference current source transistor to which a current is supplied from a current source;
a first line connecting a gate of the first reference current source transistor and a gate of a first current source transistor;
a branch point from the first line where a second line branches between the gate of the first reference current source transistor and the gate of a first current source transistor;
a first ramp signal generation unit connected to the first current source transistor; and
a second ramp signal generation unit connected to a second current source transistor,
wherein the second line is connected to a gate of the second current source transistor.
2. The ramp signal output circuit according to claim 1, wherein a potential changing quantity per unit time of a ramp signal generated by the second ramp signal generation unit is greater than a potential changing quantity per unit time of a ramp signal generated by the first ramp signal generation unit.
3. The ramp signal output circuit according to claim 1, further comprising:
a first sampling and holding capacitor configured to hold a voltage of the first line; and
a second sampling and holding capacitor configured to hold a voltage of the second line.
4. The ramp signal output circuit according to claim 1, further comprising a switch configured to control a connection relationship between the first reference current source transistor and the first line independently of the second line.
5. The ramp signal output circuit according to claim 1, further comprising:
a first grounded-gate transistor connected to the first current source transistor;
a second grounded-gate transistor connected to the second current source transistor;
a first grounded-gate line connected to a gate of the first grounded-gate transistor; and
a second grounded-gate line connected to a gate of the second grounded-gate transistor,
wherein the first grounded-gate line and the second grounded-gate line are independent lines between the first reference current source transistor and the first current source transistor.
6. The ramp signal output circuit according to claim 1, wherein the first current source transistor and the second current source transistor each have a different size.
7. The ramp signal output circuit according to claim 1, wherein the first current source transistor includes a plurality of transistors, and
wherein a transistor size is changed by changing a number of transistors that are in an on-state among the plurality of transistors.
8. The ramp signal output circuit according to claim 1, wherein a first ramp signal and a second ramp signal are output from the ramp signal output circuit.
9. A photoelectric conversion apparatus comprising:
the ramp signal output circuit according to claim 8;
a plurality of pixels; and
a comparator configured to compare a signal output from the plurality of pixels and a ramp signal output from the ramp signal output circuit.
10. The photoelectric conversion apparatus according to claim 9, wherein the comparator includes a first comparator to which the first ramp signal is input and a second comparator to which the second ramp signal is input.
11. The photoelectric conversion apparatus according to claim 9, wherein a plurality of semiconductor substrates including a first semiconductor substrate on which the plurality of pixels is arranged and a second semiconductor substrate on which the ramp signal output circuit is arranged is layered.
12. A ramp signal output circuit comprising:
a first reference current source transistor to which a current from a first current source is supplied;
a second reference current source transistor to which a current from a second current source is supplied;
a first line connecting a gate of the first reference current source transistor and a gate of a first current source transistor;
a second line connecting a gate of the second reference current source transistor and a gate of a second current source transistor;

a first ramp signal generation unit connected to the first current source transistor; and a second ramp signal generation unit connected to the second current source transistor.

13. The ramp signal output circuit according to claim 12, wherein a potential changing quantity per unit time of a ramp signal generated by the second ramp signal generation unit is greater than a potential changing quantity per unit time of a ramp signal generated by the first ramp signal generation unit.

14. The ramp signal output circuit according to claim 12, further comprising:
   a first sampling and holding capacitor configured to hold a voltage of the first line; and
   a second sampling and holding capacitor configured to hold a voltage of the second line.

15. The ramp signal output circuit according to claim 12, further comprising a switch configured to control a connection relationship between the first reference current source transistor and the first line independently of the second line.

16. The ramp signal output circuit according to claim 12, further comprising:
   a first grounded-gate transistor connected to the first current source transistor;
   a second grounded-gate transistor connected to the second current source transistor;
   a first grounded-gate line connected to a gate of the first grounded-gate transistor; and
   a second grounded-gate line connected to a gate of the second grounded-gate transistor,
   wherein the first grounded-gate line and the second grounded-gate line are independent lines between the first reference current source transistor and the first current source transistor.

17. The ramp signal output circuit according to claim 12, wherein the first current source transistor and the second current source transistor each have a different size.

18. The ramp signal output circuit according to claim 12, wherein the first current source transistor includes a plurality of transistors, and
   wherein a transistor size is changed by changing a number of transistors that are in an on-state among the plurality of transistors.

19. The ramp signal output circuit according to claim 12, wherein a first ramp signal and a second ramp signal are output from the ramp signal output circuit.

20. A photoelectric conversion apparatus comprising:
   the ramp signal output circuit according to claim 12;
   a plurality of pixels; and
   a comparator configured to compare a signal output from the plurality of pixels and a ramp signal output from the ramp signal output circuit.

* * * * *